(12) United States Patent
Barruel et al.

(10) Patent No.: US 10,141,460 B2
(45) Date of Patent: Nov. 27, 2018

(54) PHOTOVOLTAIC STRUCTURE FOR A ROADWAY

(71) Applicants: COMMISSARIAT A L'ENERGIE ATOMIQUE ET AUX ENERGIES ALTERNATIVES, Paris (FR); COLAS, Boulogne Billancourt (FR)

(72) Inventors: Franck Barruel, Le Bourget du Lac (FR); Eric Coquelle, Versailles (FR); Jean-Luc Gautier, Guyancourt (FR); Eric Pilat, Brison-Saint-Innocent (FR)

(73) Assignees: COMMISSARIAT A L'ENERGIE ATOMIQUE ET AUX ENERGIES ALTERNATIVES, Paris (FR); COLAS, Boulogne Billancourt (FR)

( * ) Notice: Subject to any disclaimer, the term of this patent is extended or adjusted under 35 U.S.C. 154(b) by 319 days.

(21) Appl. No.: 14/767,385

(22) PCT Filed: Feb. 11, 2014

(86) PCT No.: PCT/IB2014/058908
§ 371 (c)(1),
(2) Date: Aug. 12, 2015

(87) PCT Pub. No.: WO2014/125415
PCT Pub. Date: Aug. 21, 2014

(65) Prior Publication Data
US 2016/0035911 A1    Feb. 4, 2016

(30) Foreign Application Priority Data
Feb. 12, 2013 (FR) .................... 13 51191

(51) Int. Cl.
*H01L 31/044* (2014.01)
*H01L 31/0236* (2006.01)
(Continued)

(52) U.S. Cl.
CPC ............ *H01L 31/0236* (2013.01); *E01C 9/00* (2013.01); *E01C 15/00* (2013.01); *H01L 31/048* (2013.01);
(Continued)

(58) Field of Classification Search
CPC ....... H01L 31/00–31/078; Y02E 10/50–10/60; H02S 10/00–10/40;
(Continued)

(56) References Cited

U.S. PATENT DOCUMENTS 7,191,568 B1 * 3/2007 Choate ................ C09K 3/149
                                                    404/19
2004/0146349 A1 * 7/2004 Saito ..................... C09D 5/004
                                                    404/14
(Continued)

FOREIGN PATENT DOCUMENTS

| EP | 1 088 798 | 4/2001 |
| JP | 9 18041 | 1/1997 |
| JP | 2002 21036 | 1/2002 |

OTHER PUBLICATIONS

English Translation for JP2002021036 (Year: 2002).*
International Search Report dated Mar. 28, 2014 in PCT/IB14/058908 Filed Feb. 11, 2014.

*Primary Examiner* — Bach T Dinh
(74) *Attorney, Agent, or Firm* — Oblon, McClelland, Maier & Neustadt, L.L.P.

(57) ABSTRACT

A photovoltaic structure, or a photovoltaic structure for a roadway suitable for circulation of pedestrians and vehicles, including: at least one photovoltaic cell; and a non-opaque coating covering at least a front face of the photovoltaic cell and having an outer surface which is macrotextured and microtextured irregularly, with a mean texture depth MTD, measured according to the norm NF EN 13036-1, of between 0.2 mm and 3 mm, and a polishing resistance value (Continued)

Figure 1:
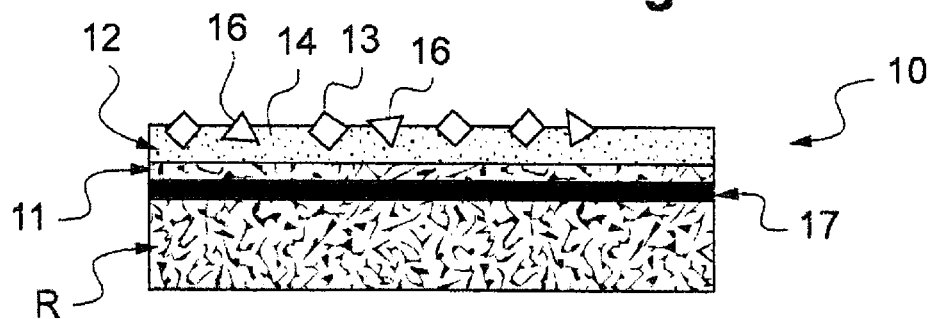

PRV, according to the norm NF EN 13043, of at least $PRV_{44}$, or $PRV_{50}$, or $PRV_{53}$.

34 Claims, 4 Drawing Sheets

(51) Int. Cl.
| | | |
|---|---|---|
| *H02S 20/21* | (2014.01) | |
| *E01C 9/00* | (2006.01) | |
| *E01C 15/00* | (2006.01) | |
| *H01L 31/048* | (2014.01) | |
| *H01L 31/18* | (2006.01) | |
| *H02S 20/26* | (2014.01) | |
| *F24S 20/64* | (2018.01) | |

(52) U.S. Cl.
CPC .............. *H01L 31/18* (2013.01); *H02S 20/21* (2014.12); *H02S 20/26* (2014.12); *F24S 20/64* (2018.05); *Y02B 10/10* (2013.01); *Y02B 10/20* (2013.01); *Y02E 10/50* (2013.01)

(58) Field of Classification Search
CPC ......... H02S 20/00–20/32; H02S 30/00–30/20; H02S 40/00–40/40; H02S 50/00–50/15; H02S 99/00; F24J 2/54–2/5431; F24J 2002/5434–2002/5496
USPC ................................ 136/243–265; 404/1–136
See application file for complete search history.

(56) References Cited

U.S. PATENT DOCUMENTS

| | | | |
|---|---|---|---|
| 2005/0199282 A1 | 9/2005 | Oleinick et al. | |
| 2007/0163645 A1* | 7/2007 | Gonda ................. | H01G 9/2031 |
| | | | 136/263 |
| 2007/0289243 A1* | 12/2007 | Arguelles ............... | E04D 1/045 |
| | | | 52/518 |
| 2010/0229945 A1* | 9/2010 | Suzuta ..................... | B32B 7/12 |
| | | | 136/259 |
| 2011/0123770 A1* | 5/2011 | Greer ..................... | E01F 9/512 |
| | | | 428/143 |
| 2011/0302858 A1 | 12/2011 | Siewert | |

\* cited by examiner

PHOTOVOLTAIC STRUCTURE FOR A ROADWAY

The present invention relates to photovoltaic structures, intended in particular to form a roadway suitable for pedestrian and vehicular traffic and having in particular an outer surface that reproduces the texture of a trafficable road surface dressing.

PRIOR ART

There is a need to use roads as a means of producing energy during the day, whether this is to supply buildings located in the vicinity (businesses, eco-districts, single-family houses, etc.) or to supply the power grid or traffic control devices.

Owing to the extent of the surface area of the road network, this could make it possible to avoid fields of solar modules that use arable land for energy production or to increase the surfaces that are currently usable such as roofs.

US 2005/0199282 A1 discloses a roadway that incorporates a photovoltaic structure, comprising solar cells covered by a non-opaque surfacing that must withstand the weight of vehicles and provide a sufficient coefficient of friction to allow the latter to travel without skidding.

As examples of surfacings, mention is made of materials such as transparent plastics surface-coated with an abrasion-resistant layer, tempered or annealed glass, a complex formed of 5 mm glass beads bonded by an epoxy resin onto annealed glass, with a preference for a complex formed of polycarbonate-backed acrylic.

The structure may have frictional elements at the surface that are intended to increase the coefficient of friction. These frictional elements may be arranged in patterns such as long or short straight or curved lines, circles or other geometrical figures.

The frictional elements may be formed by bars or spikes or by grooves cut into the surface of the surfacing. The frictional elements, when they are added, may be made of stainless steel or of polycarbonate.

There is a need to further improve the photovoltaic structures intended for pedestrian or vehicular traffic.

SUMMARY

One subject of the invention is, according to a first of its aspects, a photovoltaic structure (also referred to as complex) in particular for a roadway suitable for pedestrian and vehicular traffic, comprising:
- at least one photovoltaic cell,
- a non-opaque surfacing, covering at least the front face of said photovoltaic cell and having an irregularly macrotextured and microtextured outer surface with a mean texture depth MTD measured according to the NF EN 13036-1 standard of between 0.2 mm and 3 mm and a PSV (polished stone value) value according to the NF EN 13043 standard of at least $PSV_{44}$, better still $PSV_{50}$, even better still $PSV_{53}$.

The term "irregularly" is understood to mean the fact that the reliefs giving the macrotexture and the microtexture do not all have the same shape or the same size. These reliefs may be obtained from texturing elements that do not have the same shape or the same size, being non-calibrated. The nature, the mean size, the mean aspect ratio and the mean surface density of the texturing elements are specifically chosen so as to obtain the desired MTD and PSV values.

Unlike the uniformly textured structure presented in patent application US 2005/0199282, a structure according to present invention has, at the surface, an irregular, preferably random, dispersion of non-opaque relief elements, of irregular and preferably random shape themselves, which approaches the surface appearance of a well-known surface dressing of the road industry. Furthermore it has both macroscopic-scale (macrotexture) and microscopic-scale (microtexture) topographies favorable to grip. Therefore, the particular surface characteristics of the present invention are selected to have favorable levels of macrotexture and of microtexture that meet specifications in terms of MTD and PSV making the surfacing suitable for traffic.

Moreover, the present invention is preferably carried out using texturing elements such as glass grains which 1) replicate the texture of a road and provide measured grip properties that conform to the specifications (BO [Official Bulletin] 2002-10: circular 2002-39 of 16 May 2002 relating to the grip of new treads and the control of the macrotexture) and 2) can be applied, if this is desired, to construction sites using public works machinery and techniques.

In one of its embodiments, the structure according to the present invention is a trafficable encapsulated photovoltaic unit.

The surfacing of a structure according to the invention makes it possible, owing to the texture of its outer surface, to exhibit the grip suitable for vehicular or pedestrian traffic, while effectively protecting the photovoltaic cells positioned beneath this surfacing.

The invention makes it possible to not replace existing roadways; the structure according to the invention may be compatible with most of these roadways without requiring excavations or the laying of thick and rigid photovoltaic blocks.

Furthermore, the invention makes it possible to use the know-how and the customary equipment that is used for manufacturing and maintaining road surfacings (finishing machines, spreading of binder and gravel, etc.).

Thus, the invention allows easy implantation of the photovoltaic structure and, from an economic viewpoint, makes it possible to significantly reduce the laying and integration costs.

The grip characteristics of the surfacing according to the invention are preferably close to those of conventional bituminous road surfacings and the optical characteristics are compatible with obtaining a satisfactory conversion efficiency of the solar energy into electrical energy.

The photovoltaic structure according to the invention may be produced according to two methods of implementation in particular.

According to a first method of implementation, the photovoltaic cells are present within one or more modules covered by the non-opaque and textured surfacing, the module(s) being inserted between this surfacing and the underlying road. In particular, the surfacing may, according to this first method of implementation, also extend to the portion of the road bearing the photovoltaic modules but not covered thereby, or else be limited to just the surface of the modules. The latter may be attached to the roadway by a tie layer.

According to a second method of implementation, the photovoltaic cells are encapsulated in the non-opaque and textured surfacing, the surfacing then extending preferably both on top of and underneath the photovoltaic cells. The surfacing may extend in contact with a tie layer deposited on the road or directly in contact therewith. In particular, according to this second method of implementation, the surfacing may be preassembled with one or more photovoltaic modules, containing the photovoltaic cells, preferably using a mold.

Another subject of the invention is, according to another of its aspects, independently of or in combination with the aforegoing, a photovoltaic structure suitable for pedestrian and vehicular traffic, comprising at least one photovoltaic cell encapsulated in a non-opaque surfacing, having an irregular, textured, outer surface that is suitable for pedestrian and vehicular traffic.

Another subject of the invention is, according to another of its aspects, independently of or in combination with the aforegoing, a photovoltaic structure suitable for pedestrian and vehicular traffic, comprising at least one photovoltaic cell covered by a surfacing that has an outer surface textured with an irregular relief, characterized by aggregates of irregular shape and/or by an imprint of aggregates of irregular shape.

Another subject of the invention is, according to another of its aspects, independently of or in combination with the aforegoing, a photovoltaic structure suitable for pedestrian and vehicular traffic, comprising a surfacing that covers at least one photovoltaic cell, this surfacing comprising a bituminous binder, a clear road binder of synthetic or plant origin, resins, adhesives or polymers, such as epoxy or polyurethane, and optionally texturing elements such as aggregates or grains made of glass, that provide surface texturing.

Another subject of the invention is, according to another of its aspects, independently of or in combination with the aforegoing, a photovoltaic structure that makes it possible to produce a roadway, in the form of a rolled-up flexible sheet, to be rolled out in order to form the wearing surface, comprising photovoltaic cells and a surfacing that covers them, this surfacing having a textured outer surface.

According to all these subjects of the invention, the surfacing may be as defined subsequently, in the same way as the texturing elements used.

Another subject of the invention is a process for manufacturing a photovoltaic structure, in particular according to the first aspect as defined above, comprising the steps consisting in:
positioning texturing elements, preferably aggregates of irregular, in particular random, shape, in the bottom of a mold, the texturing elements preferably being arranged in a single layer,
positioning one or more photovoltaic cells in the mold,
injecting or casting a non-opaque material in the fluid state into or in the mold in order to cover the photovoltaic cell(s), and retain the texturing elements. Preferably, the texturing elements are positioned with a given surface density.

Another subject of the invention is a process for manufacturing a photovoltaic structure, in particular according to the first aspect as defined above, comprising the steps consisting in:
positioning one or more photovoltaic cells in a mold,
injecting or casting a non-opaque material in the fluid state into or in the mold,
before curing said material, embedding texturing elements, preferably aggregates of irregular, in particular random, shape, in its surface, the texturing elements preferably being arranged in a single layer.

Another subject of the invention is a process for manufacturing a photovoltaic structure, in particular according to the first aspect as defined above, comprising the steps consisting in:
positioning one or more photovoltaic cells in a mold, the bottom of which is textured, preferably with a relief that reproduces the imprint of aggregates of irregular, in particular random, shape, and
injecting or casting a non-opaque material in the fluid state, which is intended to cure, into or in the mold. Preferably, the reliefs that reproduce the imprint of the texturing elements are distributed with a given surface density.

Another subject of the invention is a process for manufacturing a photovoltaic structure, in particular according to the first aspect as defined above, comprising the steps consisting in:
positioning one or more photovoltaic cells in a mold,
depositing a transparent polymer film of given thickness on the photovoltaic cell(s),
depositing texturing elements, preferably aggregates of irregular, in particular random, shape, on its surface, the texturing elements preferably being arranged in a single layer,
subjecting the assembly to a hot pressurized laminator, the heat ensuring the softening of the film and enabling the aggregates to be embedded therein. Preferably, the texturing elements are positioned with a given surface density.

In all the processes involving texturing elements, the latter are preferably trapped between one quarter and three quarters of their height, preferably at around mid-height. The production of a single layer is preferable for reasons of photovoltaic performance.

Thus, in a first embodiment, texturing elements such as transparent aggregates are spread to saturation, and ideally as a single layer, on the bottom of a mold. Once the transparent material which will have been injected or molded therein attains its final mechanical properties, the aggregates will be set in the material and will provide surface texturing.

In a second embodiment, transparent aggregates are inserted in the surface of the molded photovoltaic complex, ideally before the injected or molded transparent material has completely cured.

In a third embodiment, one face of the casting or injection mold advantageously reproduces the imprint of a texture valid for a road application, in particular having the desired MTD and PSV values, defined above. The cast or injected transparent material then reproduces said texture.

Surfacing

The surfacing according to the invention is advantageously produced so as to have technical characteristics suitable both for pedestrian and vehicular traffic but that also enable its use in the photovoltaic field. In particular, these characteristics relate to the transparency and the surface texturing of said surfacing.

Transparency

In order to guarantee the desired photovoltaic performance, the surfacing is non-opaque. It advantageously has a degree of transparency of between 50% and 95%.

In order to characterize the degree of transparency, a spectrophotometer equipped with an integrating sphere is used. This device makes it possible to quantify the light which passes directly through the sample and that which is scattered by the sample, for a range of wavelength values, in steps of 5 nm for example, this range preferably lying around the peak of efficiency of the photovoltaic cells, plus or minus 100 nm.

The degree of transparency is measured for the thickness of surfacing passed through by the light incident upon the wearing surface, before reaching the photovoltaic cells.

The surfacing to be characterized is used on a glass plate. This plate is first characterized in terms of transparency by using the same spectrophotometer. The measurement is carried out in accordance with the protocol described above and the transparency values obtained are subtracted from those of the glass plate.

In order to have a characterization of the optical efficiency of the structure according to the invention, the transmission values are weighted by the spectral response (sensitivity depending on the wavelengths) of the photovoltaic cells, the sensitivities of which in the blue (450-520 nm) and in the violet (380-450) may be different depending on the type of technology used. Since the maximum efficiency of the current technologies is in the green around 600 nm, the surfacing is preferably produced so that in the range 500 to 700 nm, its degree of transparency is greater than 50%.

Surface Texturing:

In order to guarantee the desired grip performance, the surfacing according to the invention is advantageously produced so as to have an outer surface which is both macrotextured and microtextured.

Macrotexture

The macrotexture of the surfacing characterizes the surface irregularities in the range 0.5 to 50 mm horizontally (according to the NF EN ISO 13473-1 standard); the macrotexture facilitates the drainage of the water at the surface of the structure according to the invention and makes it possible to avoid loss of tire/roadway grip in rainy weather.

A macrotexture has a texture wavelength ranging from 50 mm to 0.5 mm and a microtexture has a texture wavelength of less than 0.5 mm.

The macrotexture preferably has an irregular relief, which is advantageously obtained owing to a well-defined choice of texturing elements, with a size and a surface density that are specifically chosen, of irregular, in particular random, shape, such as aggregates, or being the imprint of texturing elements of irregular shape, inspired by the surface topography of road surface dressings.

Furthermore, the outer surface of the coating has a macrotexture depth preferably such that the mean texture depth MTD measured according to the NF EN 13036-1 standard is at least 0.20 mm, and preferably 0.30 mm, and ideally 0.60 mm or more, preferably being between 0.2 mm and 3 mm.

Microtexture

The surface of the surfacing also has a microtexture, in order to ensure good grip of the tires.

The microtexture characterizes the surface irregularities, the characteristic horizontal size of which is less than 0.5 mm, according to the NF EN ISO 13473-1 standard.

The grip of the surfacing of the invention with respect to traffic, which conveys the quality of the microtexture, must remain after polishing, and may be expressed:

in terms of coefficient of friction $\mu_{WS}$, measured with a Wehner and Schulze machine. Such a machine firstly carries out up to 180 000 polishing cycles on the surface to be measured (disk with a diameter of 225 mm), obtained by three cones under a mixture of water and silica. Secondly, the device accelerates a head bearing three rubber-based pads having a size of 30 mm×14.5 mm each up to 3000 rpm, which corresponds to a tangential speed of 100 km/h. Water at 10° C. is sprayed onto the surface to be characterized until a theoretical water film thickness of 0.5 mm is formed. At that moment, the pads are applied to the surface to be measured with a pressure of 0.2 N·mm$^{-2}$, equivalent to a tire pressure of 2 bar. The coefficient of friction $\mu_{WS}$ is calculated at the speed of 60 km/h, and may be given in terms of polished stone value PSV;

in terms of Polished Stone Value (PSV), using a friction pad as described in the NF EN 1097-8 standard. The surfacing according to the invention advantageously has a PSV value according to the NF EN 13043 standard of at least $PSV_{44}$, preferably $PSV_{50}$, and ideally $PSV_{53}$.

Irregular Nature of the Texture

The coating according to the invention has an irregularly macrotextured and also irregularly microtextured outer surface.

It should be understood that the relief of the macrotexture or of the microtexture is not reproduced in an identical manner, due to the use of texturing elements that do not have the same shape or the same size, and that are not calibrated. The relief may have a random nature, both in its macrotexture and its microtexture. The texturing elements are for example shards or grains of glass, as specified below.

DETAILED DESCRIPTION

Figure 2:
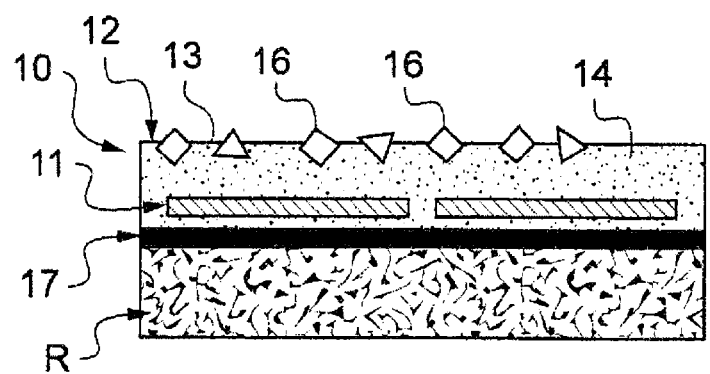
Figure 3:
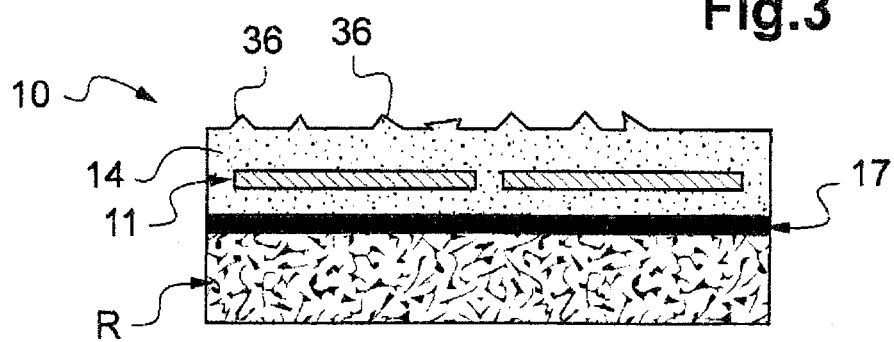

The invention will be better understood on reading the following description, of exemplary embodiments that are not limiting thereto, and on examining the appended drawing, in which:

FIG. 1 schematically represents, in cross section taken through the thickness, an example of a roadway equipped with a photovoltaic structure according to the invention, FIGS. 2 and 3 are views similar to FIG. 1, of the embodiment variants of the photovoltaic structure, FIGS. 4A to 4E illustrate the production of a structure and the use thereof according to one exemplary embodiment of the invention, and FIGS. 5A to 5E and 6A to 6D are views similar to FIGS. 4A to 4E, of embodiment variants of the invention.

In the drawing, the relative proportions of the various constituent elements have not always been respected, for the sake of clarity. Likewise, the texturing elements have been represented very schematically, in a reduced number, in order to simplify the drawing. The conventional electrical connection elements have not been represented.

A first example of a photovoltaic structure 10 according to the invention is represented in FIG. 1. The structure 10 comprises one or more modules 11 containing photovoltaic cells and a transparent surfacing 12 that covers this or these modules 11.

The surfacing 12 mechanically protects the photovoltaic cells while allowing pedestrian and vehicular traffic and its transparency enables production of electrical energy by the modules 11.

The structure 10 has an irregular, granular, outer surface 13, preferably having a random relief.

The surfacing 12 is for example formed, as illustrated, from a binder 14, also referred to as a matrix, embedded in which are transparent texturing elements 16, such as aggregates formed from glass shards or glass grains, giving the outer surface 13 its granular appearance. The texture of the surfacing may also be produced by structuring of the surface, without inclusion of aggregates in the binder.

The terms "transparent", "translucent" and "non-opaque" are considered to be synonyms within the context of the present invention.

The texture of the surfacing 12 guarantees a road holding similar to "conventional" roads, preferably with MTD and PSV values as defined above.

The photovoltaic modules 11 may be flexible or semi-rigid, or even rigid.

A tie layer 17 may ensure the attachment of the module(s) 11 to the road R, which may be new or existing.

The example from FIG. 1 corresponds to the first method of implementation of the invention, defined above, according to which the surfacing 12 extends on top of the photovoltaic module(s) 11 and is not inserted between the latter and the underlying road. Other variants will be described below.

Irrespective of the embodiments, the binder used preferably has a degree of transparency ranging from 80% to 100%.

Preferably, the material of the surfacing is selected so that the latter remains transparent over time, which can be verified via aging tests in a climatic chamber, by following for example the NFT 30-049 standard. The surfacing will lose no more than 20% after 5 days of aging in the WOM (Weather O Meter) according to the NFT 30-049 standard and preferably no more than 10% of its initial transparency.

The structure illustrated in FIG. 1 may be produced by spreading the binder in the fluid state over the surface of the photovoltaic modules 11, and before the binder cures, the texturing elements 16 (preferably in the form of transparent aggregates of irregular shape) may be spread to saturation over the surface.

The amount of binder may be realized according to the traditional road know-how in order to trap the inclusions formed by the texturing elements, preferably at around mid-height.

Exemplary Embodiments of the Surfacing

According to a first exemplary embodiment of the surfacing, the binder is of bituminous type as defined in the NF EN 12591 standard, clear, i.e. unpigmented, the penetration classes of which determined according to the EN 1426 method may be, without limitation, 160/220, 100/150, 70/100, 50/70, 40/60, 35/50, 30/45 or 20/30 (in tenths of a millimeter). Mention will be made, for example, of the Bituclair binder sold by Colas.

According to a second exemplary embodiment of the surfacing, the binder is a clear road binder of synthetic or plant origin, the penetration classes of which determined according to the EN 1426 method may be, without limitation, 160/220, 100/150, 70/100, 50/70, 40/60, 35/50, 30/45 or 20/30 (in tenths of a millimeter). Mention will be made, for example, of the Végécol or Végéclair binders sold by Colas.

According to a third exemplary embodiment of the surfacing, the binder is of purely synthetic or plant origin nature, the binder preferably being of organic nature, preferably of polymeric nature. Mention will be made, by way of example and without limitation, of an acrylic, epoxy or polyurethane resin, such as the epoxide varnishes referred to as Vernis D sold by Résipoly, or else a Sovermol polyurethane sold by BASF.

The binders used in the invention may comprise initiators or catalysts, in particular for accelerating the curing. They may also comprise additives, thickeners, fluxes or others to facilitate the spreading and the obtaining of a film-forming surface of controlled thickness.

The binders used have a good UV resistance (both in terms of transparency and mechanical properties), water resistance, heat resistance, cold resistance and frost resistance, which can be verified in a climatic chamber, by following for example the NFT 30-049 standard, and also good adhesion to the texturing elements 16 and the surface of the photovoltaic modules 11. Furthermore, these binders advantageously have a flexibility similar to the complex formed by the wearing surface of the existing road and photovoltaic modules, namely ideally an elastic modulus of between 0.1 and 10 GPa.

The examples of surfacings given above apply for all structures according to the invention.

Examples of Texturing Elements

The production of a single layer of texturing elements 16 is preferable for reasons of photovoltaic performance, since the optical transmission drops with the thickness of material.

The choice of the nature, particle size, shape factor and surface density of the texturing elements aims to obtain:

a good angularity, allowing good grip between the tires and the roadway, under dry or wet conditions: the macrotexture thus obtained enables the drainage of water under the tire, whereas the microtexture contributes to the grip; a random texture characterized by texturing elements of random shape or that reproduces the relief of texturing elements of random shape is advantageous from this point of view;

an abrasion resistance in order to retain over time the desired road-holding quality; the use of mineral materials of great hardness, as texturing elements, is advantageous from this point of view;

a good surface finish in order to ensure correct adhesion to the binder; the use of aggregates of irregular, in particular random, shape may contribute to the good attachment of these aggregates to the matrix;

a good transparency, in order to retain the photovoltaic performance.

The texturing elements are advantageously transparent materials (glass, polycarbonate, etc.), preferably made of glass, shards or grains, preferably grains of glass (crushed recycled or new glass).

The size of these elements, differentiated using a screen, may be monodisperse or polydisperse, and range from 0.1 to 10 mm, better still from 0.4 to 4 mm, and more preferably have a size ranging from 0.9 to 1.4 mm.

In order to obtain the desired level of macrotexture, the surface density of these texturing elements at the surface of the surfacing is preferably between 0.1 and 5 kg/m$^2$, and advantageously between 0.7 and 1.5 kg/m$^2$.

The shape factor of these structuring elements, that is to say the ratio for one element between its greater length and its smaller width, is preferably less than or equal to 8 and preferably between 1 and 3.

The mean texture depth MTD of such elements preferably is close to 0.8 mm and corresponds to the ideal threshold of 0.6 mm, whereas in terms of grip and resistance to polishing, after 180 000 polishing cycles in the Wehner and Schultze machine, the texturing elements preferably have a coefficient of friction $\mu_{WS}$ of 0.4, exceeding the $\mu_{WS}$=0.30 threshold of a Polished Stone Value 50.

The examples of texturing elements above apply for all the embodiments.

The photovoltaic modules 11 may be thin, flexible or semi-rigid (for example photovoltaic modules of the Unisolar brand) and may be adhesively bonded directly to the surface of a road made of bituminous mixes or made of cement concrete. The rear face of the modules 11 is preferably sufficiently rigid and solid to protect the photovoltaic cells from any puncturing by the surface asperities of the existing road (for example by the tops of aggregates), while following the change in the surface topography of the roads (for example following the formation of ruts or a crack). For example, the rear face of the modules 11 is characterized by a fluorinated resin such as ethylene-tetrafluoroethylene, for example that sold under the name Tefzel by DuPont, preferably having a thickness of 0.2 to 5 mm.

The roadway may be new or existing, preferably being produced from bituminous mix formulations that are not very prone to rutting, so that the topography of the surface of the road only changes slightly as vehicles pass over it.

The adhesive bonding of the modules 11 to the surface of the road R is carried out with the tie layer 17, which may be formed of special industrial adhesives, or else of a bituminous binder, optionally reinforced by an addition of a polymer such as SBS, hot or as an emulsion.

In a first embodiment, the adhesive or the bituminous binder forming the tie layer 17 is directly spread on the surface of the road R, spread out as a thin layer, then the photovoltaic modules 11 are deposited thereon while the adhesive has not cured or while the bituminous binder is still viscous and tacky.

In a second embodiment, the binder intended to form the tie layer 17 is deposited in the factory on the lower face of the photovoltaic modules 11, which face may be untreated or may have undergone a plasma or corona treatment in order to promote a better adhesion to the binder; the complex thus obtained is then adhesively bonded to the road R by a slight reheating of the binder on the back of the modules 11. The complex corresponding to this second embodiment may be laid on a new or existing road.

With reference to FIG. 2, a photovoltaic structure 10 according to the second method of implementation of the invention defined above will now be described, in which the photovoltaic cell(s) 11 are encapsulated in the surfacing 12. The latter may also be attached to the road R by a tie layer 17, in the manner of the examples described previously with reference to FIG. 1.

The encapsulation ensures the (mechanical, hygrometric, leaktightness, etc.) protection of the photovoltaic cells.

Figure 4A:
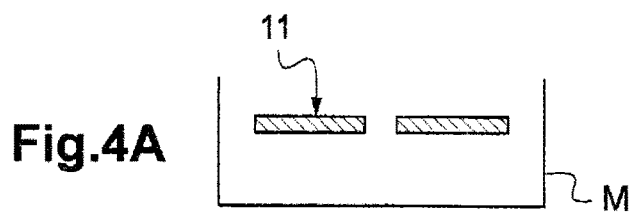
Figure 4B:
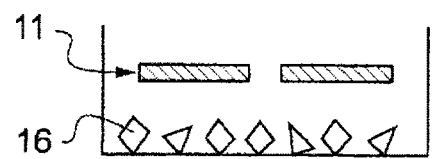
Figure 4C:
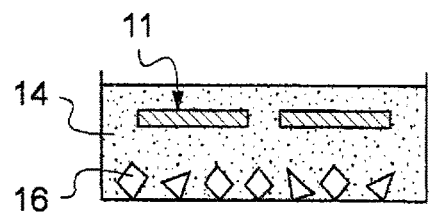
Figure 4D:
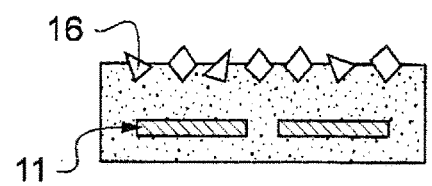
Figure 4E:
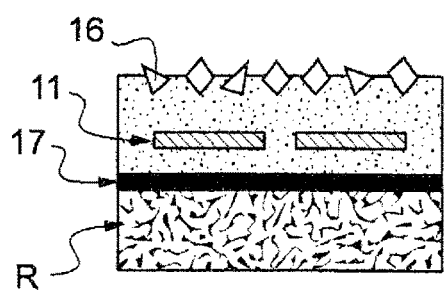
Figure 5A:
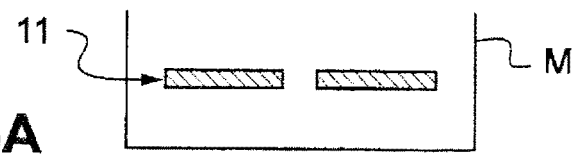
Figure 5B:
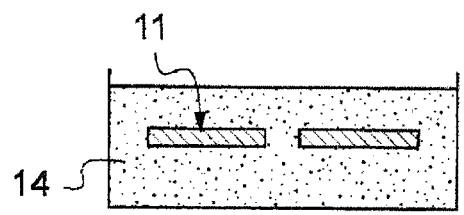
Figure 5C:
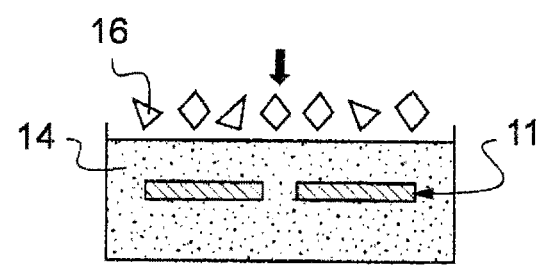
Figure 6A:
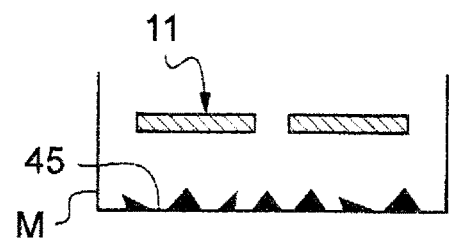
Figure 6B:
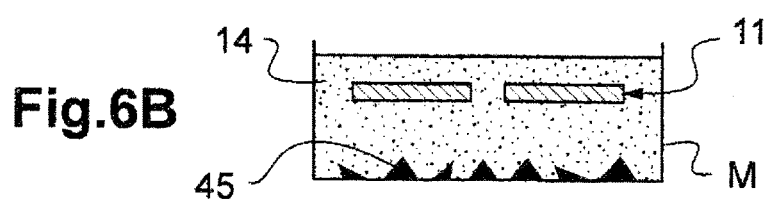
Figure 6C:
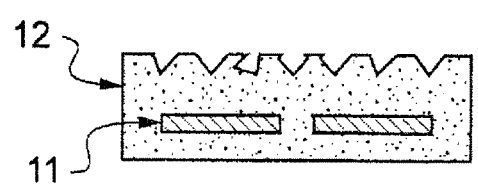
Figure 6D:
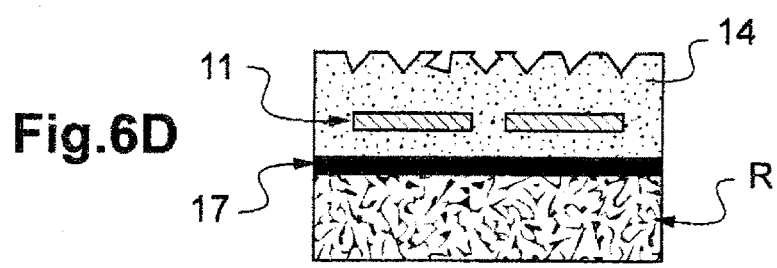

The encapsulation is preferably produced by pre-positioning the photovoltaic cell(s) 11 within a mold as illustrated in FIG. 4A, 5A or 6A, and described in detail below. Next, the structure 10 is removed from the mold and may be attached to the existing road R owing to the tie layer 17.

In order to produce the surface texture of the surfacing, in a first embodiment, illustrated in FIGS. 4A to 4E, texturing elements 16 such as transparent aggregates are spread to saturation over the bottom of a mold, preferably in the form of a single layer, in what will then be the wearing surface of the structure. A transparent binder 14 is then injected or poured into the mold. Once this material has attained its final hardness and mechanical properties, the aggregates are firmly attached to the contents of the mold and provide the desired surface texturing.

Figure 5D:
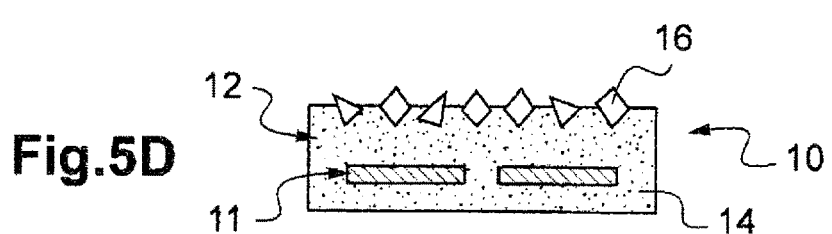
Figure 5E:
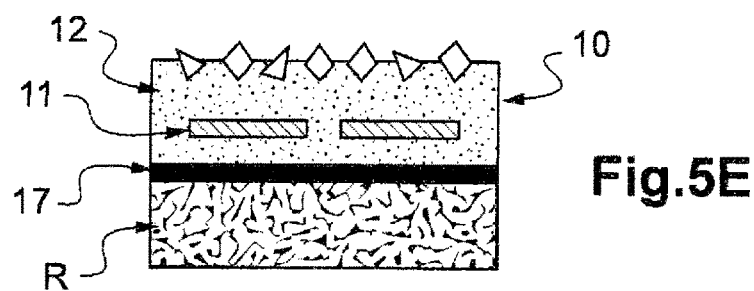

In a second embodiment, illustrated in FIGS. 5A to 5E, the transparent binder 14 is firstly injected or poured into the mold (FIG. 5B), then the texturing elements such as transparent aggregates are spread over the free surface of the mold (FIG. 5C), while the injected or poured material has not attained its final properties and still behaves as a viscous fluid. The texturing elements may be sunk in the binder via a mechanical stress or sink by means of their own weight; it is also possible to heat the texturing elements in order to melt the binder in the immediate vicinity thereof. Once the binder 14 has attained its final hardness and mechanical properties, the aggregates are firmly attached to the contents of the mold and provide the desired surface texturing (FIG. 5D).

These first two embodiments use texturing elements 16 added to the binder 14 in order to give the surfacing 12 the desired texture, preferably in the form of a single layer.

In a third embodiment, illustrated in FIG. 3 and in FIGS. 6A to 6D, the lower face 45 of the mold M is textured and the desired texture is given by the shape of this lower face. This face of the mold may reproduce an imprint of random, irregular road texture, for example that of a surface dressing having good grip to tires. After removal from the mold, a wearing surface is obtained with relief elements 36 that give the desired macrotexture and microtexture.

In a fourth embodiment:
a transparent polymer film, of given thickness, is deposited on the photovoltaic cell(s),
texturing elements, in particular aggregates of irregular, better still random, shape, are deposited on its surface, the texturing elements preferably being arranged in a single layer, and these elements are subjected to a hot pressurized laminator. The heat ensures the softening of the film and enables the aggregates to be embedded therein.

As encapsulant can be used for carrying out the invention according to the second method of implementation, use may be made of any transparent material (degree of transparency between 80% and 100%) capable of being poured or injected into a mold, in which photovoltaic cells have been pre-positioned.

The role of the binder is to mechanically protect the photovoltaic cells, to hold the optional texturing elements that will give the surface its texture, and therefore to enable the desired roadholding, while being and remaining transparent over time (by satisfying the climatic chamber aging test according to the NFT 30-049 standard for example).

The binder may be the same as according to the first method of implementation of the invention (see the section "Exemplary embodiments of the surfacing" above) and have the same characteristics.

Thus, according to a first example, the binder is of bituminous type as defined in the NF EN 12591 standard, clear (unpigmented), the penetration classes of which determined according to the EN 1426 method may be, without limitation, 160/220, 100/150, 70/100, 50/70, 40/60, 35/50, 30/45 or 20/30 (in tenths of a millimeter). Mention will be made, for example, of the Bituclair binder sold by Colas.

According to a second example, the binder is a clear road binder of synthetic or plant origin, the penetration classes of which determined according to the EN 1426 method may be, without limitation, 160/220, 100/150, 70/100, 50/70, 40/60, 35/50, 30/45 or 20/30 (in tenths of a millimeter). Use may be made of the Végécol or Végéclair binders sold by Colas.

According to a third example, the binder is of purely synthetic or plant origin nature, preferably of organic nature, preferably of polymeric nature. Mention will be made, by way of example and without limitation, of an acrylic, epoxy or polyurethane resin, such as the epoxide varnishes referred to as Vernis D sold by Résipoly, or else a Sovermol polyurethane sold by BASF.

The texturing elements may be the same as those listed in the section "Examples of texturing elements". The choice of the nature and of the particle size of these inclusions corresponds to the same criteria as those defined above. By way of example, glass aggregates, having a size of between 0.9 and 1.4 mm, may be used as texturing elements in combination with polyurethane of Sovermol type as binder. The degree of transparency of such a surfacing is between 60% and 95% at 600 nm and ideally 95%. The PSV values are preferably at least $PSV_{44}$, better still $PSV_{50}$, even better still $PSV_{53}$, and the mean texture depth MTD is preferably between 0.2 and 3 mm.

As a function of the transparency and mechanical protection objectives, the thickness of the photovoltaic structure 10 according to the invention ranges for example from 0.5 to 30 mm, ideally from 0.6 to 12 mm. It is not necessary for the thicknesses of binder on top of and underneath the photovoltaic modules or cells 11 to be identical.

The adhesive bonding of the photovoltaic structure according to this second method of implementation of the invention to the surface of the road may be carried out with special industrial adhesives, or else with a bituminous binder, optionally reinforced by an addition of a polymer such as SBS, hot or as an emulsion.

In a first embodiment, the binder is directly spread on the surface of the road, spread out as a thin layer, then the prefabricated photovoltaic structure is deposited thereon while the adhesive has not cured or while the bituminous binder is still viscous and tacky.

In a second embodiment, the binder is deposited in the factory on the lower face of the prefabricated photovoltaic structure, which face may be untreated or may have been treated by plasma or corona effect in order to promote a better adhesion to the binder; the photovoltaic structure is then adhesively bonded to the road by a slight reheating of the binder on the back thereof.

The front face may be produced during the manufacture of the photovoltaic structure in the factory.

The wearing surface may also be produced on the road construction site, after having spread the photovoltaic modules or cells over the first bituminous layers.

A photovoltaic structure according to the invention may also be proposed in the form of a textured complex that can be rolled out having a large radius of curvature, whether the upper face (after rolling out) is already pretextured or whether a layer based on a transparent binder bearing texturing elements such as transparent aggregates is added thereto. The complex may include flexible electrical paths and connectors. Construction site machinery may be used to roll out the complex on an existing road.

In a third embodiment, the surfacing is advantageously produced by impregnation using a roller. The photovoltaic structure is positioned on the road to be covered, and a roller preimpregnated with binder, in particular with resin, is passed over the structure in the style of an application of paint.

Roadway

Generally, the roadway may be new or existing, but preferably produced from bituminous mix formulations that are not very prone to rutting, so that the topography of the surface of the road only changes slightly as vehicles pass over it. The roadway may be a road, a freeway, a sidewalk.

Use of the Electrical Energy Produced

The electrical energy produced by a photovoltaic structure according to the invention may be used in various ways, for example in eco-districts, solar farms, powering public lighting, road signaling or recharging electrical vehicles, this list not being limiting.

The invention may also be used for any type of application where the concept of grip is important or for esthetic reasons.

The expression "comprising a" should be understood as being synonymous with "comprising at least one".

The invention claimed is:

1. A roadway comprising:
   (i) a road having a surface made of bituminous mixes or made of cement concrete, and
   (ii) a photovoltaic structure comprising:
      (a) at least one photovoltaic module adhesively bonded directly to the surface of the road, and
      (b) a non-opaque surfacing comprising:
         (1) a non-opaque matrix covering the at least one photovoltaic module, and
         (2) non-opaque texturing elements embedded in the non-opaque matrix,
   wherein the non-opaque texturing elements form reliefs of different shapes and different sizes on an outer surface of the non-opaque surfacing, the reliefs giving an irregular macrotexture and an irregular microtexture to the outer surface, with a mean texture depth measured according to the NF EN 13036-1 standard of between 0.2 mm and 3 mm and a polished stone value (PSV) of resistance to polishing according to the NF EN 13043 standard of at least $PSV_{44}$.

2. The roadway as claimed in claim 1, the mean texture depth being at least 0.30 mm.

3. The roadway as claimed in claim 1, the non-opaque surfacing having a degree of transparency of greater than 50% in a range of 100 nm around a peak of efficiency of the photovoltaic module.

4. The roadway as claimed in claim 1, a texture of the outer surface being defined at least partially by the non-opaque matrix.

5. The roadway as claimed in claim 1, the non-opaque matrix being selected from materials of synthetic or plant origin, bituminous binders, clear road binders of synthetic or plant origin, and polymeric binders.

6. The roadway as claimed in claim 1, a density of texturing elements at the outer surface of the non-opaque surfacing being between 0.1 kg/m$^2$ and 5 kg/m$^2$.

7. The roadway as claimed in claim 1, the texturing elements having a shape factor of less than 8.

8. The roadway as claimed in claim 1, the texturing elements being arranged in a single layer.

9. The roadway as claimed in claim 1, the texturing elements being selected from aggregates of organic or mineral, transparent or translucent, materials.

10. The roadway as claimed in claim 1, the texturing elements having a size ranging from 0.1 mm to 10 mm.

11. A process for manufacturing a photovoltaic structure as defined in claim 1, comprising:
    positioning texturing elements in a bottom of a mold;
    positioning one or more photovoltaic cells in the mold; and
    injecting or casting a non-opaque material in the fluid state into or in the mold to cover the one or more photovoltaic cells, and to retain the texturing elements.

12. A process for manufacturing a photovoltaic structure as defined in claim 1, comprising:
    positioning one or more photovoltaic cells in a mold;
    injecting or casting a non-opaque material in fluid state into or in the mold; and
    before curing the material, embedding texturing elements in its surface.

13. A process for manufacturing a photovoltaic structure as defined in claim 1, comprising:
    depositing a transparent polymer film on one or more photovoltaic cells;
    depositing texturing elements on its surface; and
    subjecting the structure to a hot pressurized laminator, heat ensuring softening of the film and enabling aggregates to be embedded therein.

14. The roadway as claimed in claim 1, the roadway having a grip suitable for traffic on a pedestrian and vehicular roadway.

15. The roadway as claimed in claim 1, the PSV value of resistance being of at least $PSV_{50}$.

16. The roadway as claimed in claim 1, the mean texture depth being at least 0.6 mm.

17. The roadway as claimed in claim 1, the non-opaque surfacing having a degree of transparency of greater than 50% in a range of 500 nm to 700 nm.

18. The roadway as claimed in claim 1, the non-opaque matrix being selected from materials of synthetic or plant origin, bituminous binders, having a penetration class according to the EN 1426 standard of 160/220, 100/150, 70/100, 50/70, 40/60, 35/50, 30/45, or 20/30 (in tenths of mm), and clear road binders of synthetic or plant origin, having a penetration class according to the EN 1426 standard of 160/220, 100/150, 70/100, 50/70, 40/60, 35/50, 30/45, or 20/30 (in tenths of mm), and polymeric binders.

19. The roadway as claimed in claim 1, a texture of the outer surface being defined at least partially by non-opaque texturing elements of irregular shape.

20. The roadway as claimed in claim 1, the texturing elements being arranged in a single layer sunk to mid-thickness approximately in the matrix of the non-opaque surfacing.

21. The roadway as claimed in claim 1, the texturing elements being selected from aggregates of polycarbonate or of glass.

22. The process according to claim 11, the texturing elements being aggregates of irregular shape arranged in a single layer.

23. The process according to claim 12, the texturing elements being aggregates of irregular shape arranged in a single layer.

24. A roadway for pedestrian and vehicular traffic, comprising a photovoltaic structure comprising at least one photovoltaic module covered by a non-opaque surfacing having an outer surface textured with non-opaque texturing elements embedded in a non-opaque matrix, wherein the non-opaque texturing elements form reliefs of different shapes and different sizes on an outer surface of the non-opaque surfacing, the photovoltaic module being adhesively bonded directly to the surface of the roadway made of bituminous mixes or made of cement concrete.

25. The roadway as claimed in claim 1, the photovoltaic module comprising at least one photovoltaic cell, a rear face of the photovoltaic module being sufficiently rigid and solid to protect the at least one photovoltaic cell from any puncturing by surface asperities of the road.

26. The roadway as claimed in claim 1, a rear face of the photovoltaic module being defined by a fluorinated resin layer.

27. The roadway as claimed in claim 26, the fluorinated resin layer having a thickness of 0.2 to 5 mm.

28. The roadway as claimed in claim 1, the photovoltaic structure comprising a tie layer adhesively bonding the photovoltaic module to the road.

29. The roadway as claimed in claim 1, the tie layer having been directly spread on the surface of the road, spread out as a thin layer before the photovoltaic module having been deposited thereon while the tie layer has not cured or is still viscous and tacky.

30. The roadway as claimed in claim 1, the texturing elements having a size in a range from 0.1 mm to 1.4 mm.

31. The roadway as claimed in claim 1, wherein a thickness of the photovoltaic structure is in a range from 0.5 to 30 mm.

32. The roadway as claimed in claim 1, wherein a thickness of the photovoltaic structure is in a range from 0.6 to 12 mm.

33. The roadway as claimed in claim 1, wherein the photovoltaic module comprises at least one photovoltaic cell and a layer of polymer beneath the photovoltaic cell, the layer of polymer defining a rear face of the photovoltaic module.

34. The roadway as claimed in claim 33, the layer of polymer being fluorinated.

* * * * *